United States Patent [19]

Booker et al.

[11] Patent Number: 5,742,030
[45] Date of Patent: Apr. 21, 1998

[54] FLEXIBLE MANUAL GAS-FILL AND BALL-WELD SEAL APPARATUS

[75] Inventors: Kent H. Booker, Ogden; Howard K. Jackman, Uintah; Kerry A. Cooke, Hooper; L. John Pierotti, Huntsville, all of Utah

[73] Assignee: Morton International, Inc., Chicago, Ill.

[21] Appl. No.: 596,655

[22] Filed: Feb. 5, 1996

[51] Int. Cl.⁶ .................................................. B21J 13/08
[52] U.S. Cl. ......................................................... 219/158
[58] Field of Search ............................... 219/158, 86.23; 280/728.1, 728.2, 730.1, 743.1

[56] References Cited

U.S. PATENT DOCUMENTS

| | | |
|---|---|---|
| 5,041,715 | 8/1991 | Muller .................... 219/121.64 |
| 5,078,422 | 1/1992 | Hamilton et al. ............ 280/736 |
| 5,196,669 | 3/1993 | Richardson ................ 219/117.1 |
| 5,280,951 | 1/1994 | Rizzi et al. ................ 280/736 |
| 5,424,509 | 6/1995 | Schaugaard et al. ......... 219/137 R |
| 5,456,492 | 10/1995 | Smith et al. ............... 280/737 |

*Primary Examiner*—Matthew V. Nguyen
*Attorney, Agent, or Firm*—George W. Rauchfuss, Jr.; Gerald K. White

[57] ABSTRACT

A developmental, manual gas-fill, ball-weld seal machine is provided to flexibly and quickly handle a wide range of inflators of different diameters and sizes for airbag applications. The change tooling for the different sizes and diameter inflators is simple and easy to replace. Completely axial clamping is provided to provide a good seal during fill and positive grounding during ball welding.

11 Claims, 5 Drawing Sheets

FLEXIBLE MANUAL GAS-FILL AND BALL-WELD SEAL APPARATUS

FIELD OF THE INVENTION

This invention relates to a manual gas-fill and ball-weld seal apparatus, and more particularly to such an apparatus which is flexibly capable of handling the gas filling and ball-weld sealing of airbag canisters of different configurations and varying sizes.

BACKGROUND OF THE INVENTION

A production-type apparatus for filling an airbag canister (inflator) with compressed gas under high pressure and the sealing off of the fill port with a resistance-welded ball is disclosed in U.S. Pat. No. 5,196,669. Such apparatus does not lend itself to the support of the development of hybrid inflators which require dealing with pressure vessels of different geometries, quick change tooling, adjustability and linear clamping for parts without an end flange to clamp onto, etc.

SUMMARY OF THE INVENTION

Accordingly, it is an object of this invention to provide a new and improved gas-fill and ball-weld seal apparatus which is suitable to support developmental activities by offering quick response to the processing of developmental hybrid airbag inflators.

Another object of this invention is to provide a new and improved gas-fill and ball-weld seal apparatus which is simple and flexible, even though existing technology is used where appropriate.

In carrying out this invention in one illustrative embodiment thereof, flexibility is provided in a gas-fill and ball-weld seal apparatus for delivering a ball to an airbag inflator having an opening therein for admitting compressed gas supplied by a compressed gas source through a fill head to an inflator and welding a ball delivered to the opening in the inflator to seal the inflator after being filled with the compressed gas to a predetermined gas pressure, said apparatus comprising a removable fill head, a manually adjustable X–Y table position under the fill head, a riser stand having a base removably mounted to the manually adjustable X–Y table and an upper mounting platform with a nest mounted thereon adapted to receive an inflator in alignment with the fill head whereby the nest, fill head and riser may be quickly replaced to accommodate a wide variety of different inflator configurations and sizes. This gas-fill and ball-weld apparatus also provides for axial clamping of the inflator while filling with gas and accommodates a positive grounding path.

BRIEF DESCRIPTION OF THE DRAWINGS

The invention together with further objects, advantages, aspects and features thereof will be more clearly understood from the following description taken in connection with the accompanying drawings in which like elements bear the same reference numerals throughout the various views.

DESCRIPTION OF THE PREFERRED EMBODIMENTS

Figure 1:
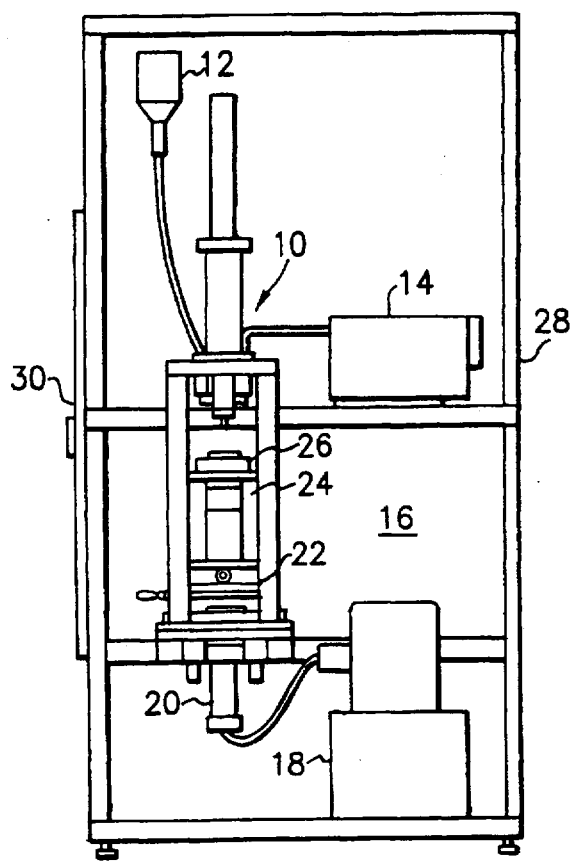
FIG. 1 is a right side elevational view, with the right side panelling removed, of a gas-fill, ball- weld apparatus in accordance with the present invention, with an inflator positioned therein.
Figure 6:
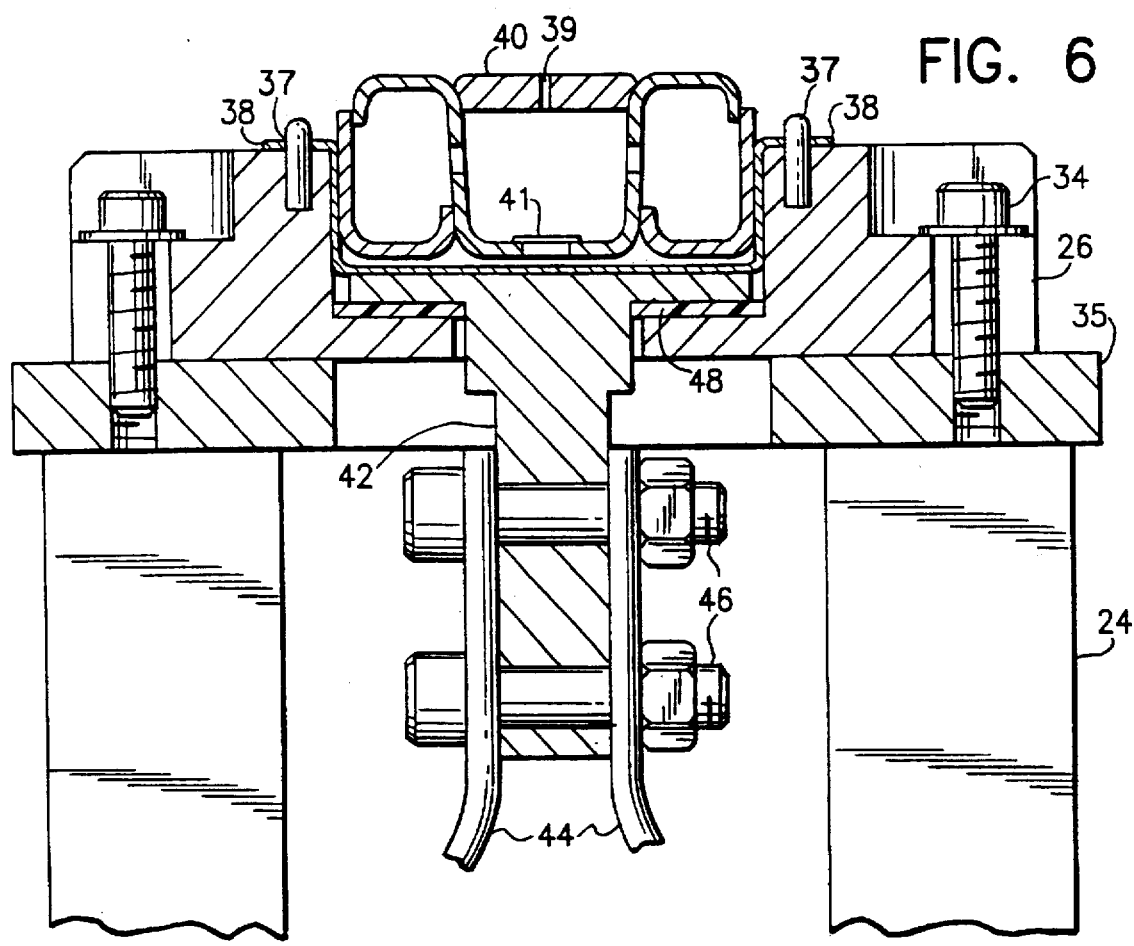
FIG. 6 is an enlarged, partly cross-sectional view of an inflator positioned in the nest as shown in FIG. 2.

Referring now to FIG. 1, there is shown a right side view of the gas-fill, ball-weld apparatus, with portions of the panelling removed, which incorporates the ability to accommodate a wide variety of inflator configurations. The apparatus includes a gas-fill, ball-weld station, referred to generally with the reference numeral 10, having a ball container 12 and a welder 14. Since the gas-fill, ball-weld structure and operation of station 10 is shown and described in the aforesaid U.S. Pat. No. 5,196,669, such structure will not be discussed in detail. An inflator mounting and clamping station, referred to generally with the reference numeral 16, includes a hydraulic power unit 18 shown coupled to hydraulic cylinder 20. All such operations are manual in keeping with the function of the present invention as a developmental tool for handling development of different types and sizes of inflators for airbags. The inflator mounting and clamping station 16 includes an X–Y table 22, a riser stand 24 mounted on the X–Y table 22 and a nest 26 which is adapted to receive and hold an inflator 40 having a small diameter fill hole 39 (FIG. 6) through which the inflator is to be filled with pressurized gas and then sealed by the apparatus. Due to the flexibility of the apparatus, the fill hole 39 location may be varied and is not critical. The apparatus is enclosed by a panelled frame 28 with door panels 30.

Figure 2:
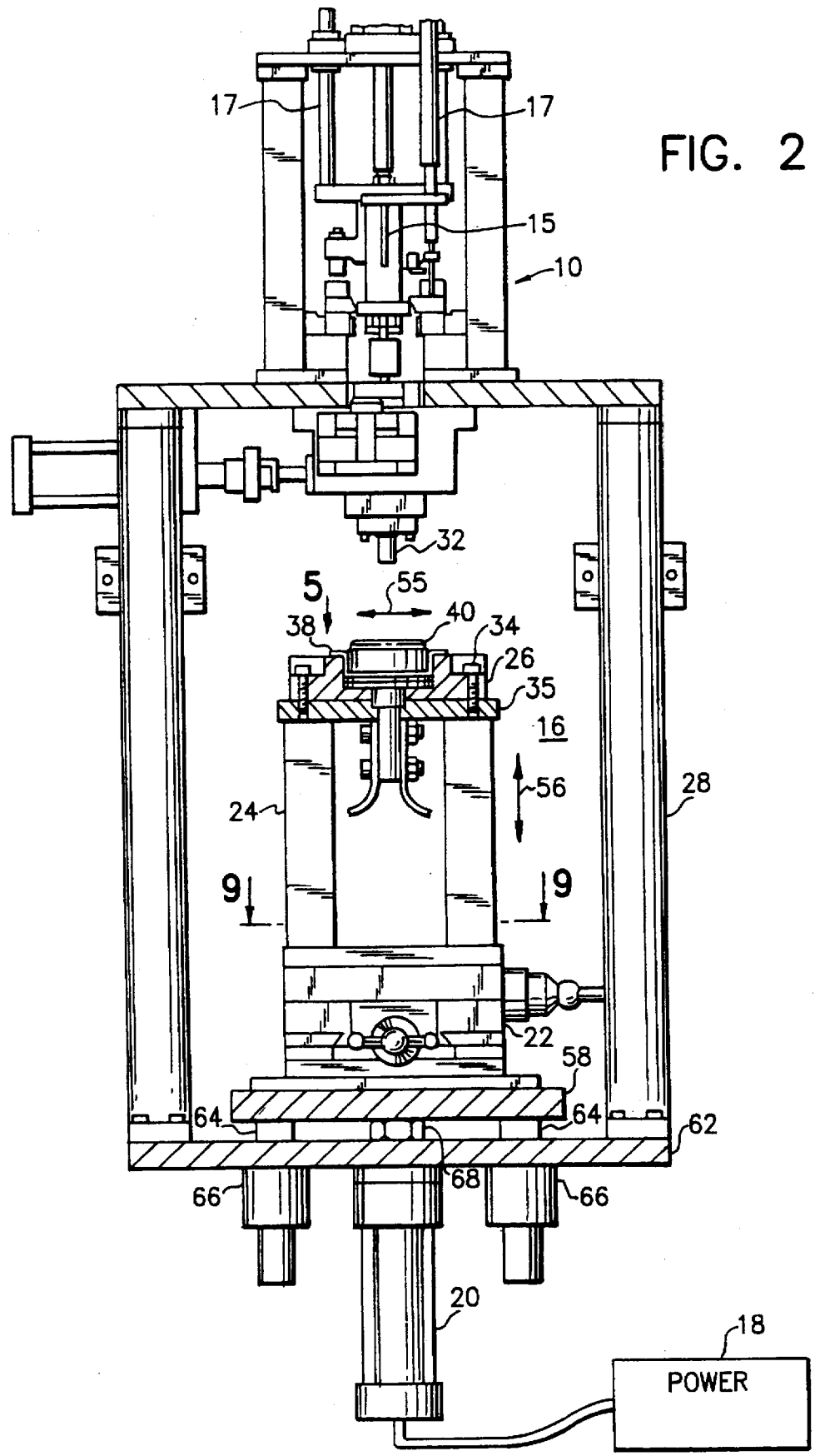
FIG. 2 is an enlarged front view, partly in section, of a portion of the gas-fill, ball-weld apparatus shown in FIG. 1, with an inflator positioned therein.
Figure 7:
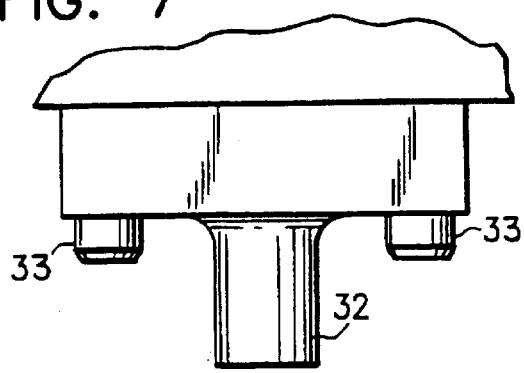
FIG. 7 is an enlarged view front elevational view of a removable fill head for the gas-fill, ball-weld station.
Figure 8:
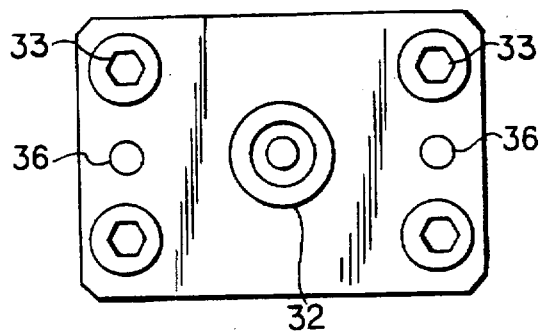
FIG. 8 is a bottom view of FIG. 7.

Referring now to FIG. 2, the gas-fill, ball-weld station 10 has a weld electrode 15 in retracted position which is provided with added guide rods 17 for increased electrode rigidity. The remainder of the gas-fill, ball-weld station 16 is the same as described in the aforesaid patent including the ball-feed mechanism, the weld electrode, and the structure for measuring the displacement of the melted ball. A removable fill head 32 is mounted on the ball-feed mechanism of the station 10 as shown in FIGS. 7 and 8 with a plurality of bolts 33. As will be seen in FIG. 8, a pair of aligned through holes 36 are positioned on each side of the fill head 32, which are used for alignment purposes as explained hereinafter.

Figure 5:
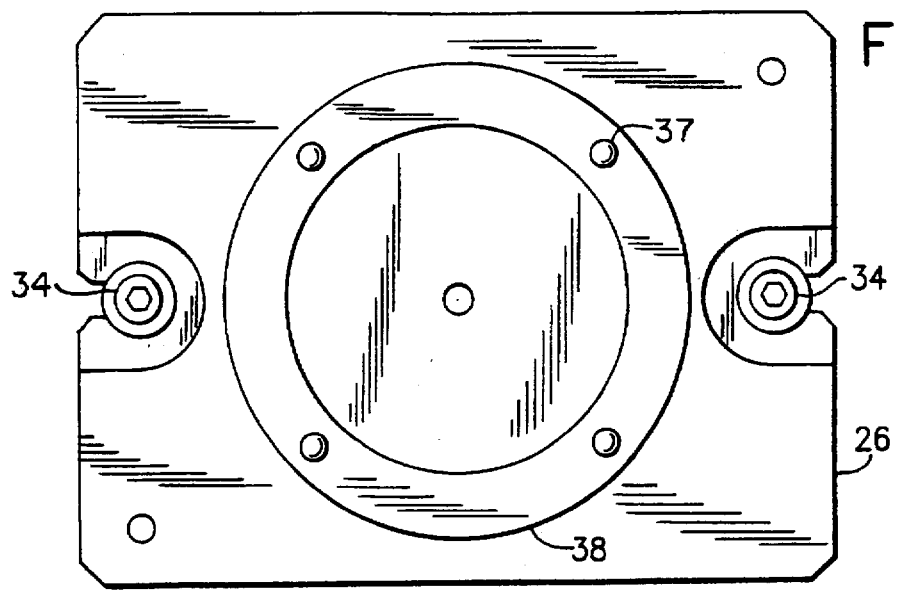
FIG. 5 is a top view of the nest, as indicated by the 5 arrow on FIG. 2.

Returning to FIG. 2 and FIGS. 5 and 6, the riser stand 24 has mounted thereon the nest 26 for receiving an inflator 40. The nest is mounted by screws 34 to a cross support 35 of the riser stand 24. The inflator 40 having a burst disk 41 has a mounting flange 38 therein which is positioned in the nest 26 by a plurality of spaced dowel pins 37. The nest 26 along with the gas-fill station 10 is designed to handle different inflator configurations in varying sizes and geometries, up to approximately 6.0" in diameter and 12.0" in height, for driver, passenger, and side impact inflators. As will best be seen in FIG. 6, the inflator 40 when positioned in the nest 26 rests on a grounding plate 42 which has electrical cables 44 firmly secured thereto by bolts 46. The cables 44 are coupled to a transformer (not shown) of the welder 14 providing a current return path for the transformer in the welder 14. The grounding plate 42 is positioned on an isolation disk 48. Accordingly, the grounding method provided is unique in that the inflator 40 is merely positioned in the nest 26 and located therein by dowel pins 37. As will be explained, an axial clamping action positively engages the ground path.

Figure 9:
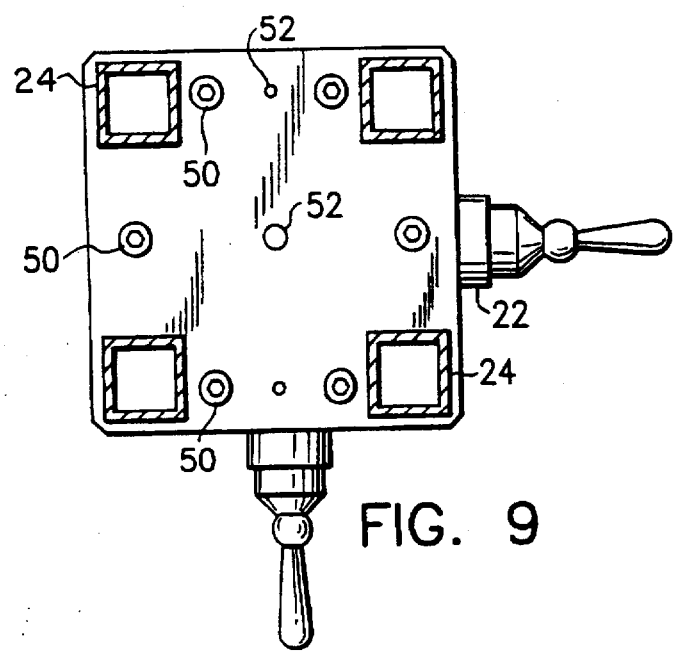
FIG. 9 is a cross-sectional view taken along line 9—9 in FIG. 2.

As will be seen in FIG. 9, the riser stand 24 is mounted on an X–Y table by a plurality of bolts 50 and aligned thereon by a plurality of dowel pins 52 which are pressed fitted into aligned holes in the top of the X–Y table 22. The X–Y table having adjustable hand wheels 21 and 23 provides a fine adjustment for the inflator 40 positioned in the nest 26 in the X direction, as indicated by arrow 54 on FIG. 2 and in the Y direction indicated by arrow 55 on FIG. 3.

Figure 3:
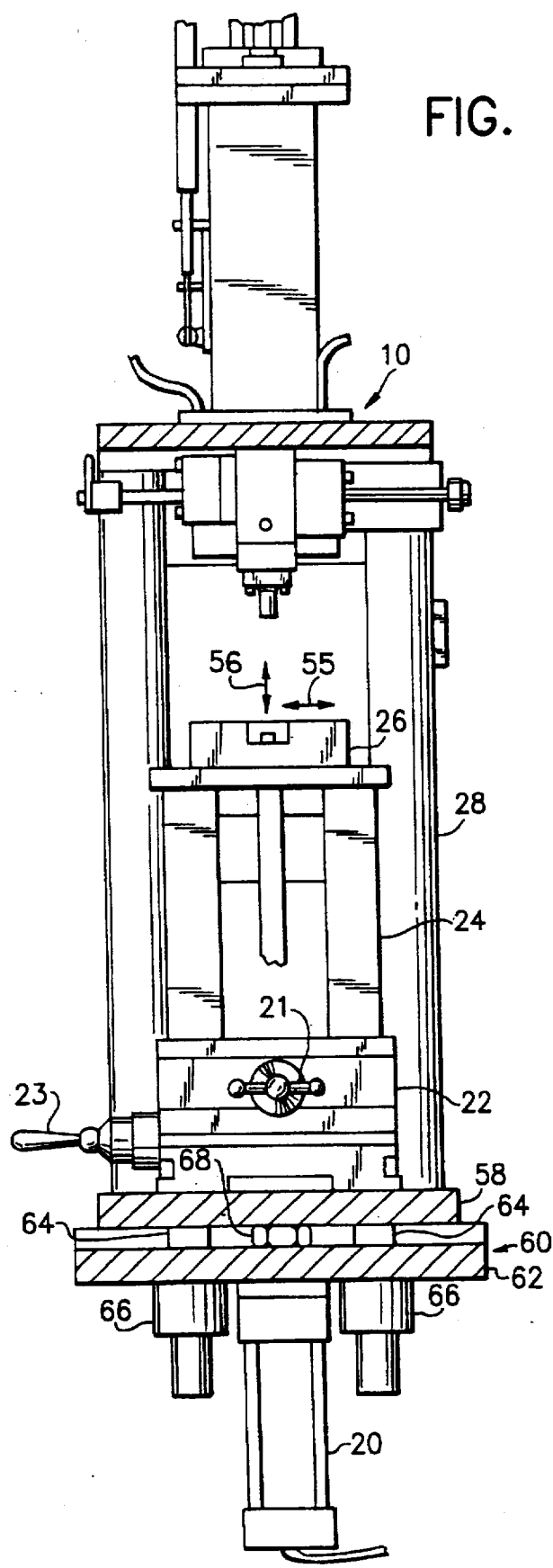
FIG. 3 is an enlarged right side view without an inflator positioned therein, of the gas-fill, ball-weld apparatus as shown in FIG. 2.

As will best be seen in FIGS. 2 and 3 (inflator removed), the X–Y table 22 is mounted for axial movement, indicated by arrow 56, on an upper die shoe 58 of a die set 60 having a lower die shoe 62 which is mounted on and forms a part of the frame 28 of the apparatus. The die set 60 is provided with guide rods 64 and linear ball bushings (not shown) in retainer sleeves 66. The piston of the hydraulic cylinder 20 is attached by nut 68 to the upper die shoe 58. This structure provides a vertical clamping action on the activation of hydraulic cylinder 20. The force generated by the hydraulic cylinder 20 vertically clamps the inflator 40 to the fill head 32 in the gas-fill, ball-weld station 10 in a purely axial fashion with the die set 60 maintaining the required vertical alignment. The vertical clamping action simultaneously engages the grounding path of the grounding plate 42 described above.

Figure 10:
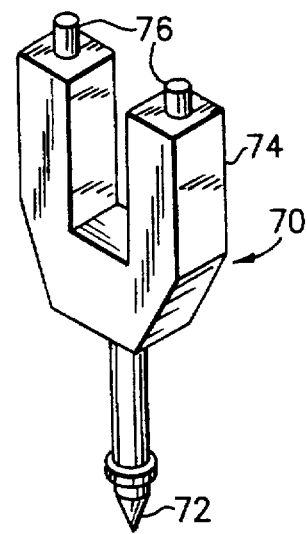
FIG. 10 shows a perspective view of an alignment tool for the gas-fill, ball-weld apparatus of the present invention.

FIG. 10 illustrates an alignment tool 70 for vertically aligning the fill head 32 with the opening in the inflator 40 when the inflator is positioned in the nest 26. The tool 70 has an alignment pin 72, adapted to fit into a fill hole 39 in an inflator 40, on one end thereof and a yoke 74 having a pair of dowel pins 76 extending therefrom. The dowel pins 76 are adapted to fit in holes 36 in the fill head 32. Accordingly, when the fill head 32 for a particular application is installed in the gas-fill, ball-weld station 10 and the complimentary inflator 40 for that fill head is positioned in the nest 26, the alignment tool 70 is engaged in the fill head 32. The X–Y table 22 is then adjusted to align the alignment pin 72 of the alignment tool 70 with the fill hole in the inflator 40. Once alignment is complete, the alignment tool is removed and the cylinder 20 is actuated to axially clamp the inflator in the gas-fill, ball-weld station 10. The inflator will then be filled with pressurized gas and sealed by a ball-weld to the inflator fill port under pressure in accordance with known procedure.

Positive axial clamping is provided on the inflator 40 to assure a good seal during gas filling. In addition, the totally axial clamping of this invention provides positive grounding on the fill port to provide a uniform current flow around the weld rather than using clamps per se as a ground.

Figure 4:
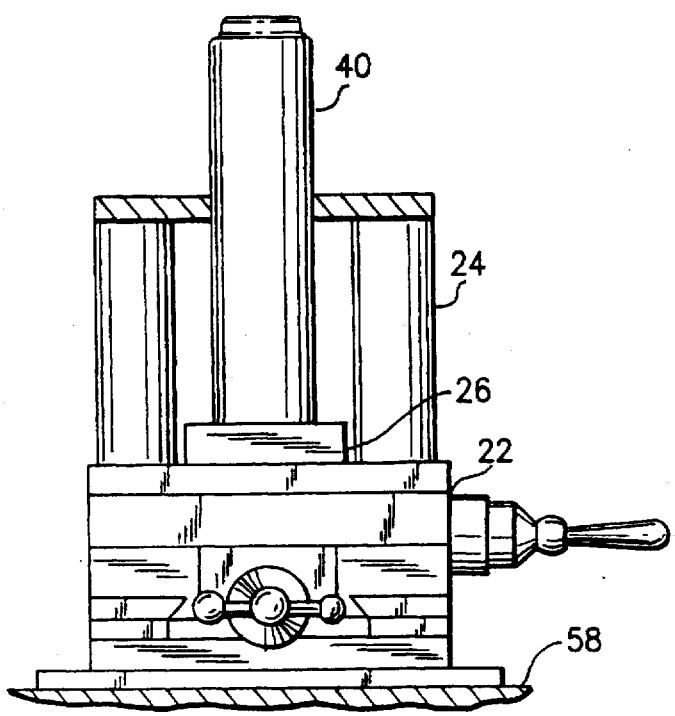
FIG. 4 is a front view of an alternate inflator configuration illustrating the flexibility of the structure mounted on the X–Y table.

FIG. 4 illustrates one of many possible alternate inflator 40 configurations in which the tooling package, namely, everything that is positioned on the X–Y table 22 for fixturing and grounding along with the fill head 32 are designed for quick change.

Accordingly, a manually operated gas-fill, ball-weld seal machine is provided which is capable of handling a wide range of inflators. The machine is flexible to quickly handle different diameters and sizes of inflators, and the change tooling is simple and easy to replace. The tooling allows for positive solely axial clamping to assure a good seal during filling as well as positive grounding to provide a good weld after filling.

Since other changes and modifications varied to fit particular operating requirements and environments will be apparent to those skilled in the art, the invention is not considered limited to the examples chosen for purposes of illustration, and includes all changes and modifications which do not constitute a departure from the true spirit and scope of this invention as claimed in the following claims and equivalents thereto.

We claim:

1. In a gas-fill and ball-weld seal apparatus having a ball-feed mechanism for delivering a ball to an airbag inflator having an opening therein for admitting compressed gas supplied from a compressed gas source to a fill head and to said inflator and welding a ball delivered to said opening from said ball-feed mechanism to seal said inflator after being filled with a compressed gas to a predetermined gas pressure:

said fill head being a removable fill head mounted on said ball feed mechanism;

a manually adjustable X–Y table positioned under said fill head;

a riser stand having a base removably mounted on said adjustable X–Y table, said riser having an upper mounting platform;

a nest mounted on said upper mounting platform of said riser stand adapted to receive the inflator in alignment with said fill head whereby said nest, said fill head and said riser may be removably replaced to accommodate a wide variety of different inflator configurations and sizes.

2. The gas-fill and ball-weld seal apparatus as claimed in claim 1, including a die shoe means on which said X–Y table is mounted, a hydraulic cylinder coupled to said die shoe means for solely axially clamping said fill head in said opening in said inflator prior to filling the inflator with compressed gas.

3. The gas-fill and ball-weld seal apparatus as claimed in claim 2 wherein said die shoe means comprises an upper die shoe on which said X–Y table is mounted and a lower die shoe mounted to a frame of said apparatus, and said hydraulic cylinder is coupled to said upper die shoe whereby said upper and lower die shoe from a die set to maintain alignment between the fill head and inflator and said lower die shoe forms part of the structure which resists axial clamping force provided by the hydraulic cylinder.

4. The gas-fill and ball-weld seal apparatus as claimed in claim 1, an alignment tool adapted to be mounted on said fill head and having an alignment pin on one end thereof and a yoke carrying dowel pins adapted to fit into holes in said fill head to position said fill head in alignment with said alignment pin.

5. The gas-fill and ball-weld seal apparatus as claimed in claim 1 wherein said nest has a plurality of openings therein receiving a plurality of dowel pins adapted to receive and mount a flange of an inflator in said nest.

6. The gas-fill and ball-weld seal apparatus as claimed in claim 1 having a grounding plate, and an isolation disk for isolating an inflator positioned in said nest from said grounding plate.

7. The gas-fill and ball-weld seal apparatus as claimed in claim 2 wherein the inflator positionable in said nest is positioned on a grounding plate isolated from said nest by an isolation disk whereby a grounding path is completed on axial clamping of the inflator in said nest by said die shoe means on the activation of said hydraulic cylinder.

8. In a gas-fill and ball-weld seal apparatus having a ball-feed mechanism for delivering a ball to an airbag inflator having an opening therein for admitting compressed gas supplied from a compressed gas source to a fill head and to said inflator and welding a ball from a ball-welding mechanism to seal said inflator after being filled with a compressed gas to a predetermined gas pressure:

said fill head being removably mounted to said ball-feed mechanism and having a spaced pair of alignment holes therein;

an adjustable X–Y table positioned under said fill head;

a riser stand having a base removably mounted on said X–Y table;

a nest mounted on said riser stand adapted to receive the inflator capable of being aligned with said fill head by the adjustment of said X–Y table;

a die shoe means having said X–Y table mounted thereon; and a hydraulic cylinder coupled to said die shoe means for axially clamping said fill head in said opening of said inflator when said hydraulic cylinder is activated.

9. The gas-fill and ball-seal apparatus as claimed in claim 8 wherein said die shoe means comprises an upper die shoe on which said X–Y table is mounted for axial movement therewith and a lower die shoe which is mounted to a frame of said apparatus; and said hydraulic cylinder is coupled to said upper die shoe through said lower die shoe whereby said upper and lower die shoes form a die set to maintain axial alignment between the fill head and the inflator and said upper shoe, riser stand, nest and inflator are axially moved and clamped to said fill head on the actuation of said hydraulic cylinder.

10. The gas-fill and ball-weld seal apparatus as claimed in claim 9 having an alignment tool having an alignment pin on one end thereof and a yoke on an opposite end thereto;

said yoke having dowel pins extending therefrom adapted to fit into said spaced pair of alignment holes in said fill head whereby when said alignment tool is mounted on said fill head, said alignment pin is positionable in said opening of said inflator for aligning said fill head with the opening in said inflator.

11. The gas-filled and ball-weld seal apparatus as claimed in claim 8 wherein said nest is positioned on a grounding plate, an isolation disk having said grounding plate positioned thereon for electrically isolating an inflator in said nest from said grounding plate until said hydraulic cylinder is activated to clamp the inflator in said nest and close a grounding path through the inflator.

* * * * *